(12) United States Patent
Lin et al.

(10) Patent No.: US 6,650,539 B1
(45) Date of Patent: Nov. 18, 2003

(54) MODULAR BACKUP POWER HOUSING

(75) Inventors: Hsin-An Lin, Changhwa Hsien (TW); Kuo-Hsien Tsai, Tali (TW)

(73) Assignee: Handsome Electronics Ltd., Taichung (TW)

( * ) Notice: Subject to any disclaimer, the term of this patent is extended or adjusted under 35 U.S.C. 154(b) by 0 days.

(21) Appl. No.: 10/173,712

(22) Filed: Jun. 19, 2002

(51) Int. Cl.[7] .............................. H05K 7/20; H05K 5/02
(52) U.S. Cl. ................ 361/690; 211/41.17; 361/732; 361/735; 361/746; 361/747
(58) Field of Search ................ 211/41.17; 165/80.3, 165/185; 361/600, 679, 688–691, 694–695, 729–730, 735, 744, 797, 802, 829–831; 454/184

(56) References Cited

U.S. PATENT DOCUMENTS

| | | | | |
|---|---|---|---|---|
| 2,959,715 A | * | 11/1960 | Leonchick | 361/735 |
| 4,321,654 A | * | 3/1982 | Nakaio et al. | 361/735 |
| 5,067,040 A | * | 11/1991 | Fallik | 361/744 |
| 5,319,520 A | * | 6/1994 | Sugiyama et al. | 361/744 |
| 5,398,159 A | * | 3/1995 | Andersson et al. | 361/735 |
| 5,544,969 A | * | 8/1996 | Ammon et al. | 361/744 |
| 5,949,653 A | * | 9/1999 | Weng | 361/735 |

* cited by examiner

*Primary Examiner*—Gregory Thompson
(74) *Attorney, Agent, or Firm*—Jones, Tullar & Cooper, P.C.

(57) ABSTRACT

A modular backup power housing consists of at least one module and a base. Additional modules may be stacked to accommodate a larger bank of power cells. Each module has a cuboid frame, multiple top rails and multiple bottom tracks. The top rails and the bottom tracks are attached to top and bottom surfaces of the cuboid frame respectively and mate with the top rails and bottom tracks of adjacent modules or the base. By virtue of the interlocking top rails and bottom tracks, the total height of the modular backup power housing is less than a conventional housing, and the strength and stability of the modular backup power housing is improved.

17 Claims, 8 Drawing Sheets

MODULAR BACKUP POWER HOUSING

BACKGROUND OF THE INVENTION

1. Field of the Invention

The present invention relates to a modular backup power housing, and more particularly to a modular backup power housing that has a structure to improve the stability of and reduce overall height of the assembled modular backup power housing.

2. Description of Related Art

Power cells or accumulators are often used in factories and telecommunications transceiver sites to supply backup electrical energy when electrical power is lost without warning. Banks of power cells or accumulators provide a prompt temporary source of electricity to keep factory production equipment or transceiver sites on line until alternate power can be made available or can be shut down in an order manner to preclude damage to the equipment.

With reference to FIGS. 8 and 9, a conventional modular backup power housing adapted to accommodate multiple cells is composed of a least two modules (50). Each module (50) is essentially a hollow cuboid shell with a top, a bottom, a front, a back and two sides and comprises a top plate (51), a bottom plate (52), two side plates (53) and multiple stringers (511). The top plate (51) and the bottom plate (52) each have an outer surface, an inner surface, two opposite ends and a front and rear edge. The side plates (53) have outer and inner surfaces and top, bottom, front and rear edges and are mounted between opposite ends of the top plate (51) and the bottom plate (52) to form the hollow cuboid shell. The stringers (511) are mounted on the outer surface of the top plate (51) and the bottom plate (52), respectively. The stringers (511) on one module (50) abut corresponding stringers (511) on adjacent modules (50). Each side plate (53) has a flange (not numbered) extending out laterally from the edges of the side plate (53). Locking holes (531) are defined in the flange to align with locking holes (531) in side plates (53) of adjacent modules (50). A bolt and a nut (not shown) through the locking holes (531) connect adjacent modules (50) so multiple power cells or accumulators can be installed in the modules (50) to form a bank.

However, the conventional modular backup power housing has the following drawbacks:

1. When multiple modules (50) are stack vertically, the stringers (511) between adjacent modules (50) increase the total height of the whole modular backup power housing. Therefore, the center of gravity of the modular backup power housing gets higher and higher when additional modules are used in the backup power bank.

2. The modular backup power housing has localized stress points because the modules (50) are only connected by bolts at certain points. The modular backup power housing easily collapses if the bolts loosen or drop out when the modular backup power housing is rocked in earthquakes and cannot provide the instantaneous electrical backup. Additionally, the cells may cause other damage, such as explosion or hurting people, when the cells slide out of the inner space of the modular backup power housing.

Manufacturers can incur a financial loss when equipment in the factory catastrophically shuts down without electricity. Furthermore, after an earthquake, rescue efforts will be delayed if the backup power banks for telecommunications transceiver sites do not work. Therefore, modular backup power housing has to be robust and stable to keep the backup power cell banks working.

The present invention has arisen to mitigate and/or obviate the disadvantages of the conventional modular backup power housing.

SUMMARY OF THE INVENTION

The main objective of the invention is to provide a modular backup power housing that has a lower center of gravity and a strong structure.

Other advantages and novel features of the invention will become more apparent from the following detailed description when taken in conjunction with the accompanying drawings.

DETAILED DESCRIPTION OF THE PREFERRED EMBODIMENT

Figure 1:
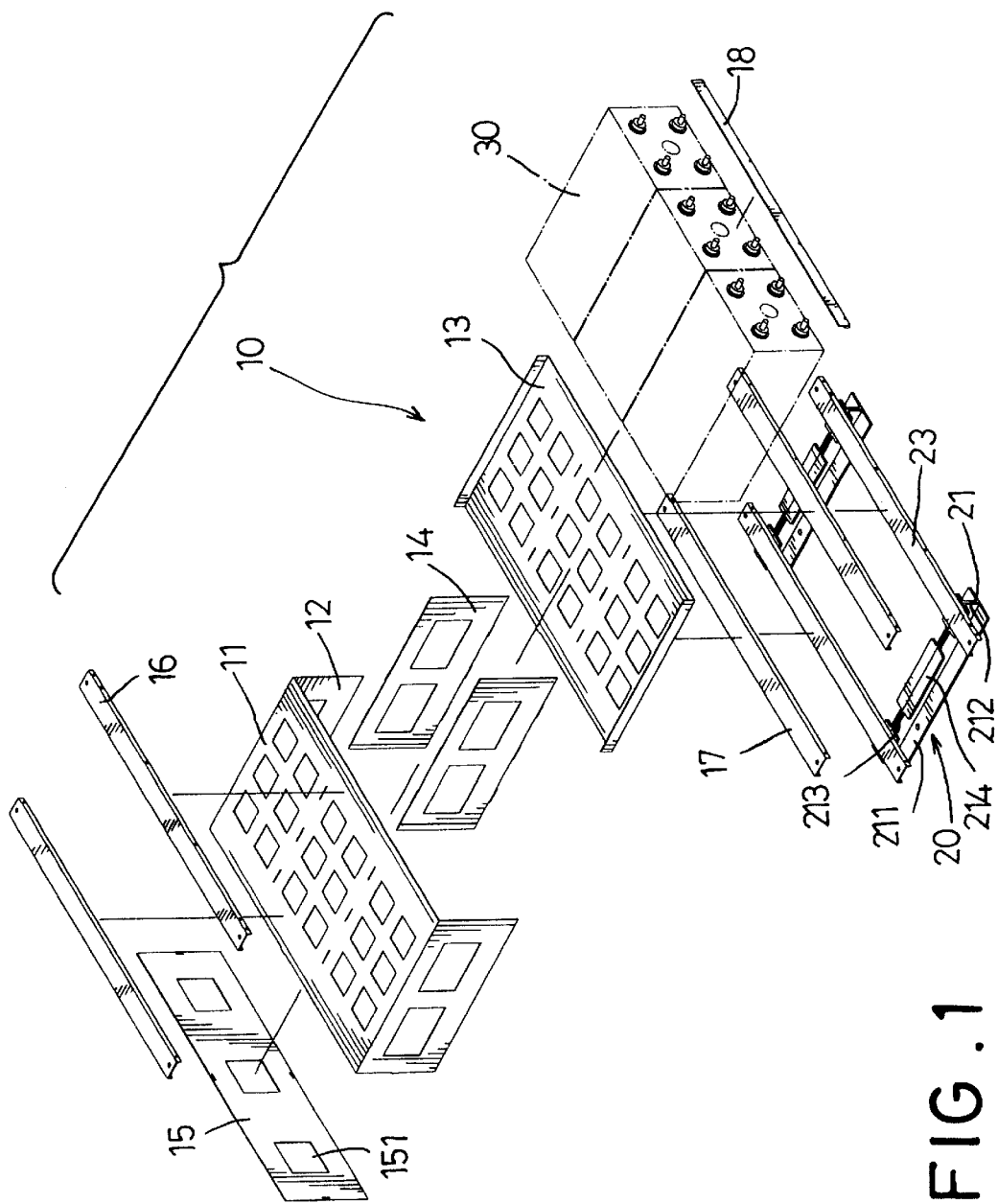
FIG. 1 is an exploded perspective view of a modular backup power housing in accordance with the present invention.
Figure 2:
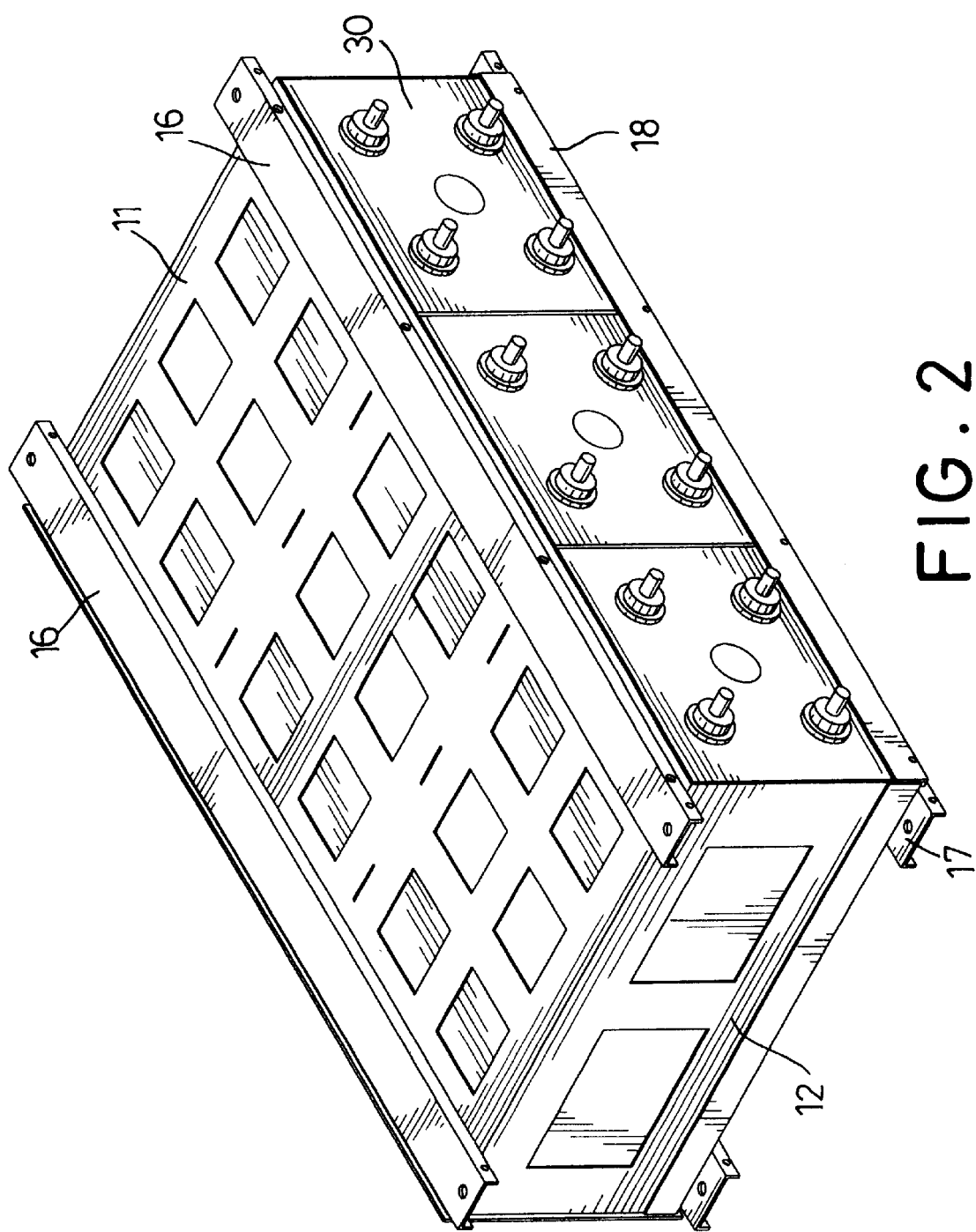
FIG. 2 is a perspective view of a modular backup power housing module in FIG. 1.

With reference to FIGS. 1 and 2, a modular backup power housing adapted to accommodate power cells (30) or accumulators in accordance with the present invention comprises at least two modules (10). Each module (10) is essentially a hollow cuboid frame with a top, a bottom, a front, a back and two sides and comprises a top plate (11), two side plates (12), a bottom plate (13), a rear plate (15), two top rails (16), two bottom tracks (17), multiple stop elements and at least one dividing plate (14).

The side plates (12) are mounted perpendicular between the top plate (11) and the bottom plate (13) to form a rudimentary cuboid frame with a front and rear opening (not numbered) and an inner space (not numbered). The top plate (11) and the bottom plate (13) have inner and outer surfaces (not numbered). The at least one dividing plate (14) is mounted parallel to the side plates (12) inside the cuboid frame between the top plate (11) and the bottom plate (13) to divide the inner space into multiple compartments in which individual power cells (30) are mounted. The rear plate (15) is mounted over the rear opening of the cuboid frame, and an access hole (151) is defined in the rear plate (15) to correspond to each compartment. Therefore, a user can push the cell (30) out of the compartment by pushing through the access hole (151). Additionally, multiple ventilating holes are defined in the top, side, bottom and dividing plates (11, 12, 13, 14) so the heat generated when the cells (30) provide electricity can be dissipated.

The top rails (16) and bottom tracks (17) are attached to the outer surfaces of the top plate (11) and the bottom plate (13), respectively. Each top rail (16) and each bottom track (17) is U-shaped and has two ends, an open side, a transverse plate and two wing plates. The top rail (16) is mounted on the top plate (11) with the open side facing the top plate (11). The bottom track (17) is mounted on the bottom plate (13) with the open side away from the outer surface of the bottom plate (13). The top rail (16) has a width smaller than that of the bottom track (17) so that the top rail (16) on one module (10) can be snugly mounted in the bottom track (17) of the adjacent module (10). Additionally, a through hole (not numbered) is defined near each end of the transverse plate, and multiple threaded holes (not numbered) are defined in each wing plate of the top rails (16) and the bottom tracks (17).

The modular backup power housing further comprises a base (20) to attach the modular backup power housing to a floor or foundation. The base (20) has two support members (21) and two parallel top rails (23) mounted on and perpendicular to the support member (21) to correspond to the bottom tracks (17) of the bottom module (10) in the bank. Each support member (21) is an I-beam composed of a bottom beam (211), a web (212) and a top beam (214). Multiple holes (not numbered) are defined in the bottom beam (211) to allow spikes or studs and bolts (not shown) to securely attach the support member (21) to the floor or foundation. Multiple cutouts (213) are defined in the top beam (214) to correspond to the holes of the bottom beam (211) to provide access to the spikes or studs and bolts. The top rails (23) are the same configuration as the top rails (16) on the modules (10) and are mounted on the top beam (214). The top rails (23) on the base (20) engage the corresponding bottom rails (17) on the bottom module (10) of the bank.

Figure 3:
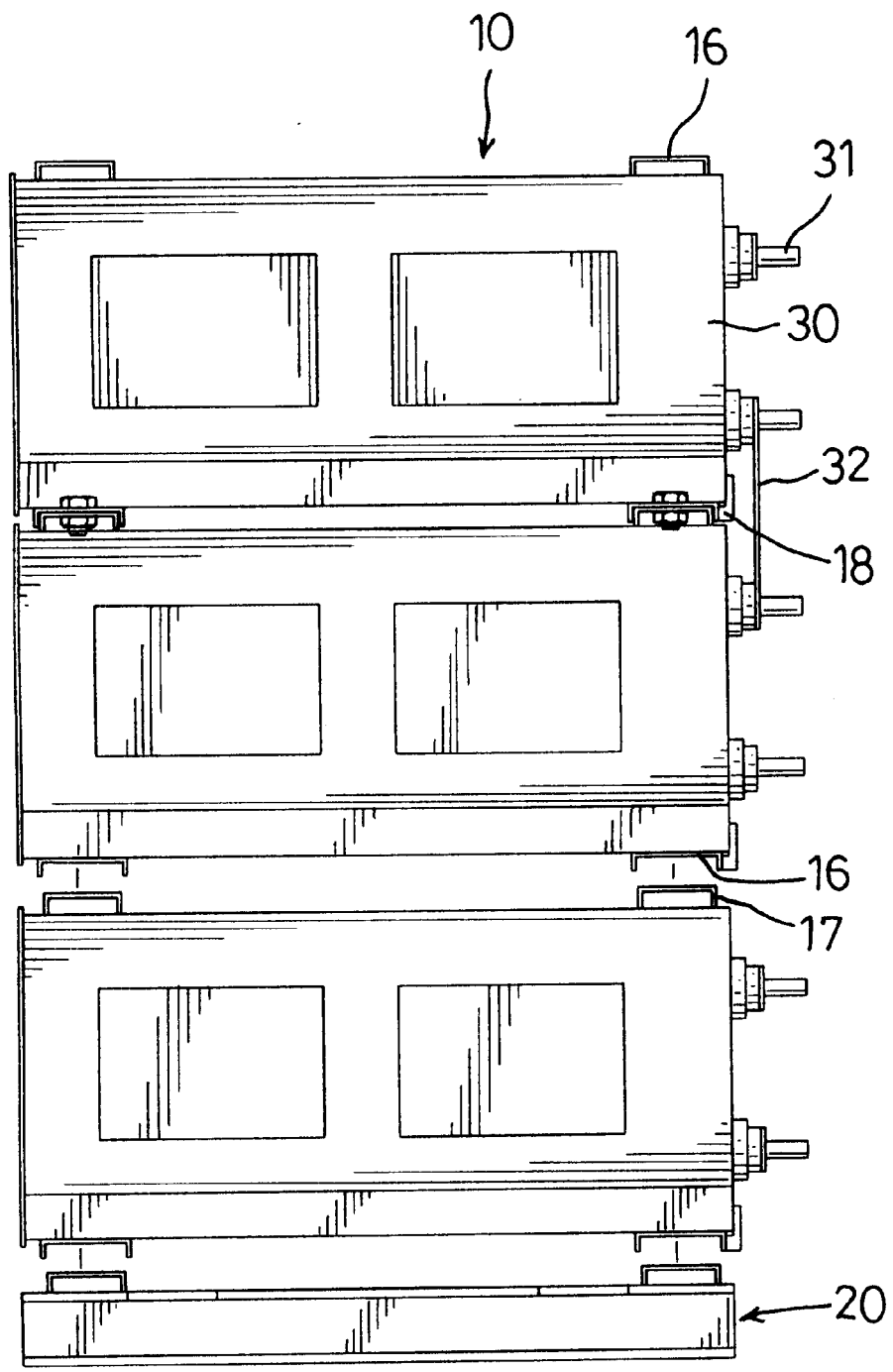
FIG. 3 is a side plan view of the modular backup power housing with a base, wherein the modules are stacked vertically.
Figure 4:
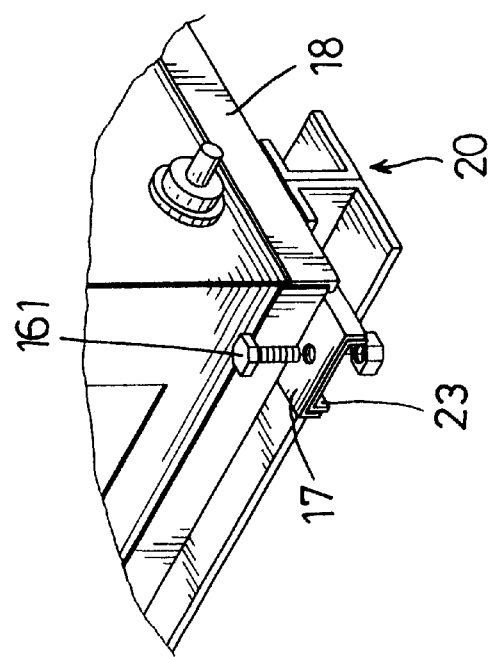
FIG. 4 is an enlarged perspective view of the connection between a modular backup power housing module in FIG. 2 and a base.

With reference to FIGS. 3 and 4, when the modular backup power housing is assembled, the top rail (16) of one module (10) and the bottom rail (17) of the adjacent module (10) mesh with each other and are held in place by bolts (161) through the through holes in the transverse plates of the top rails (16) and bottom tracks (17). The power cells (30) are electrically connected to the adjacent power cells (30) by conductive bus bars (32) connected to terminals (31) of the cells (30).

Figure 5:
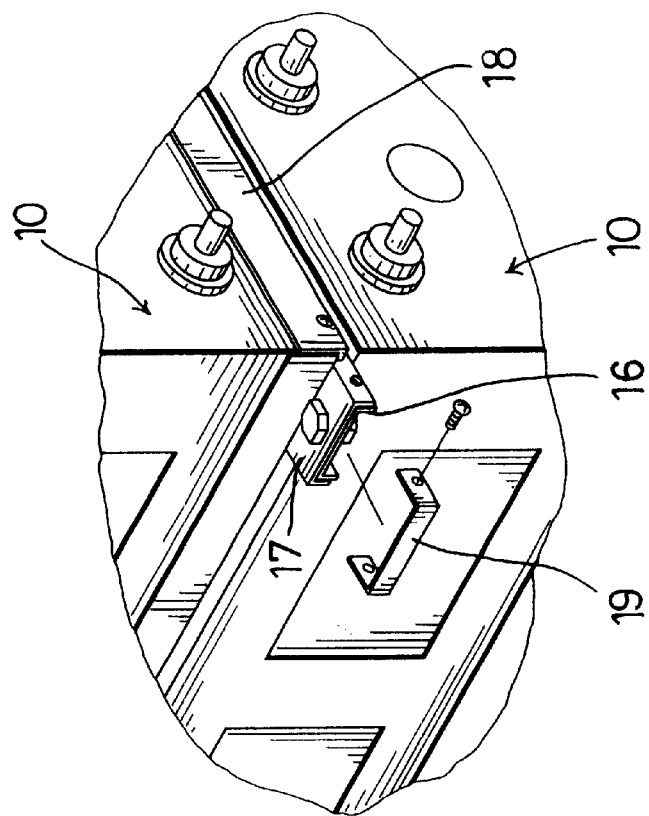
FIG. 5 is an enlarged perspective view of the connection between two modular backup power housing modules.

With reference to FIG. 5, the modular backup power housing further comprises a U-shaped locking frame (19) mounted around each end of the bottom tracks (17) by bolts. The U-shaped locking frames (19) keep the top rails (16) from sliding out of the bottom tracks (17). Alternately, the top rails (16) and bottom tracks (17) further have another securing means, such as locking tabs (not shown) formed at the ends of the transverse plate of the top rails (16) and bottom tracks (17). The locking tabs keep the top rails (16) from sliding in the bottom tracks (17) and further stiffen the modular backup power housing.

Figure 6:
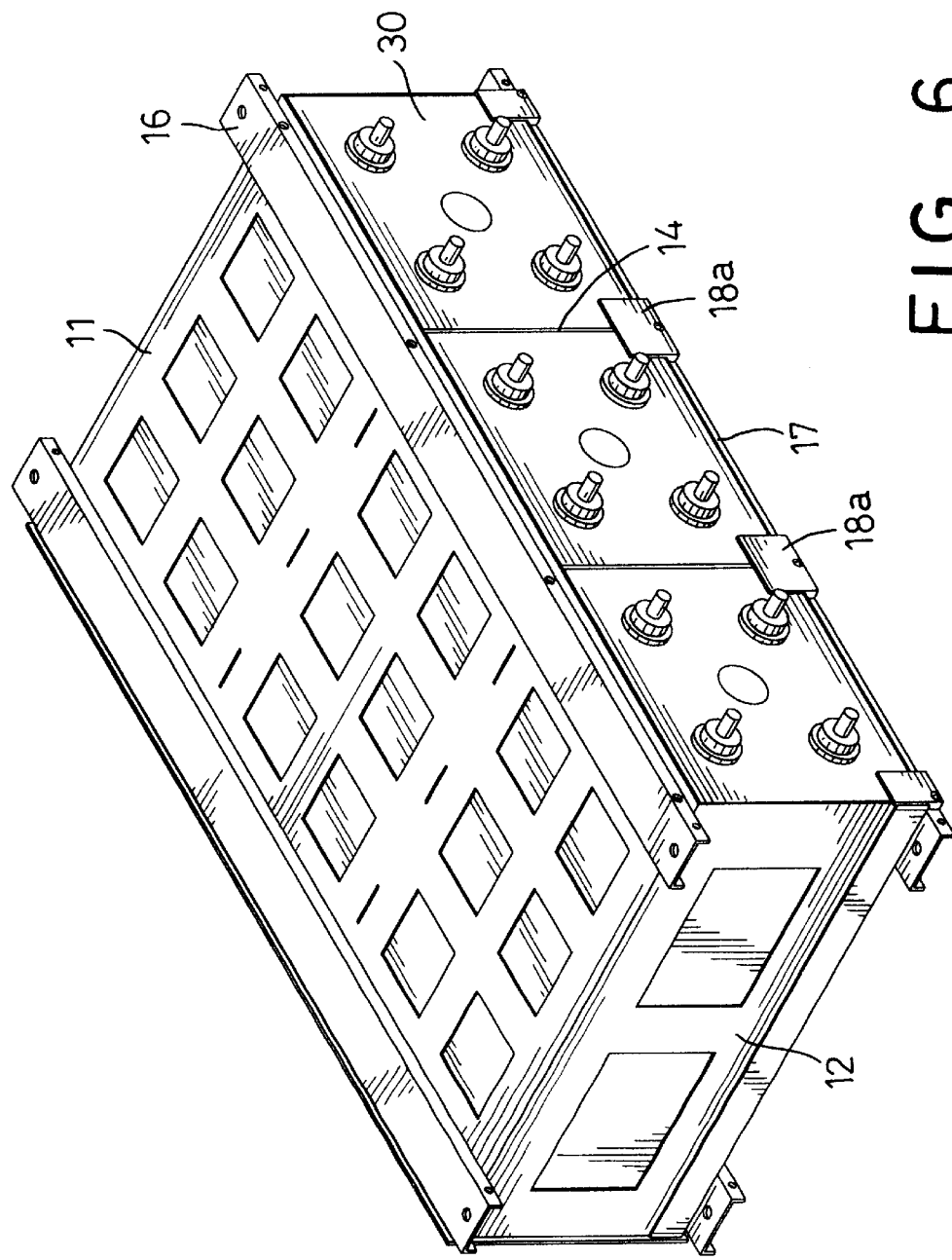
FIG. 6 is a perspective view of the modular backup power housing module in FIG. 2 with multiple edge hasps mounted on each module.
Figure 7:
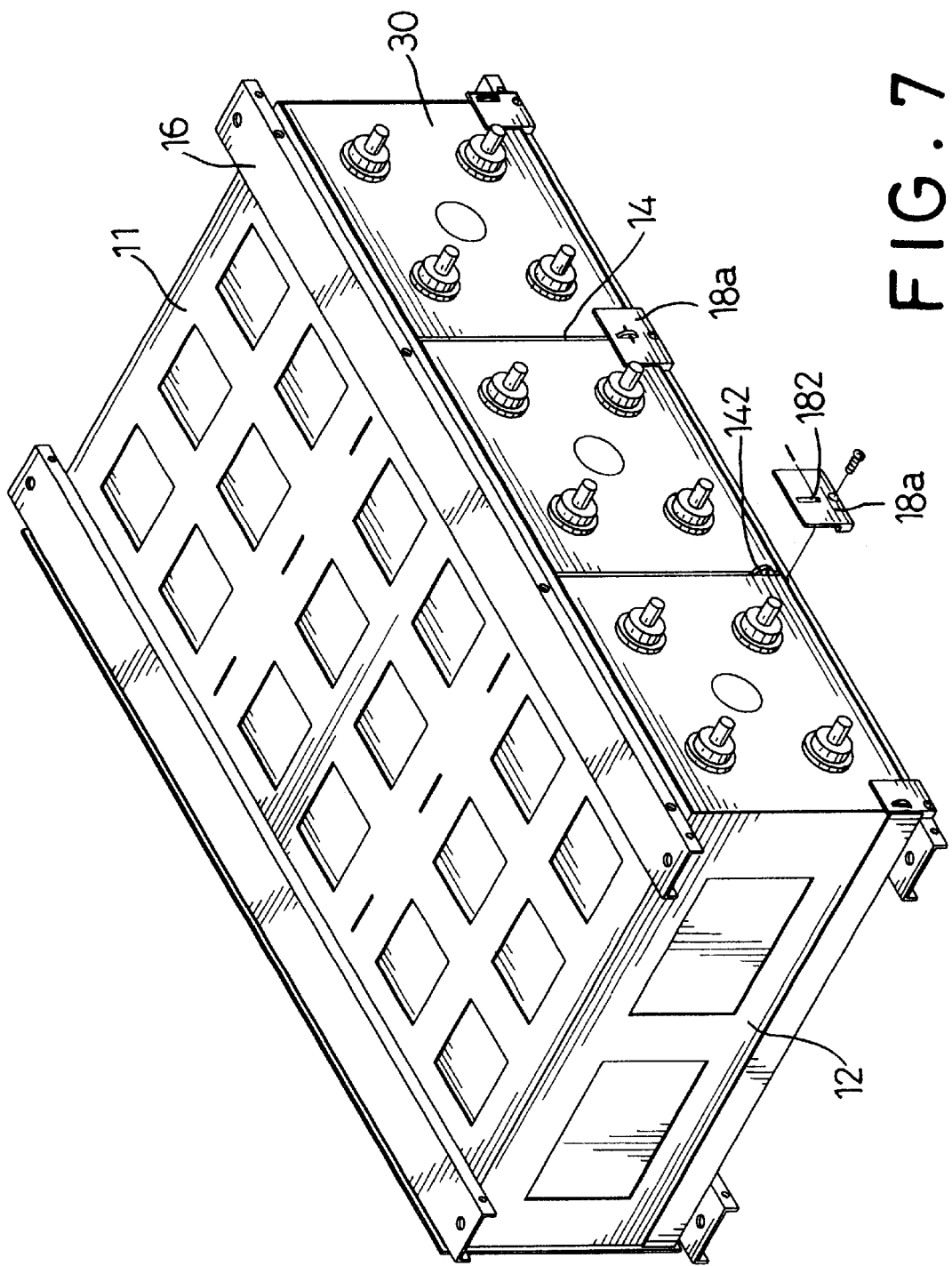
FIG. 7 is a perspective view of the modular backup power housing module in FIG. 2 showing multiple locking tabs on each dividing plate engaged with the. edge hasps.
Figure 8:
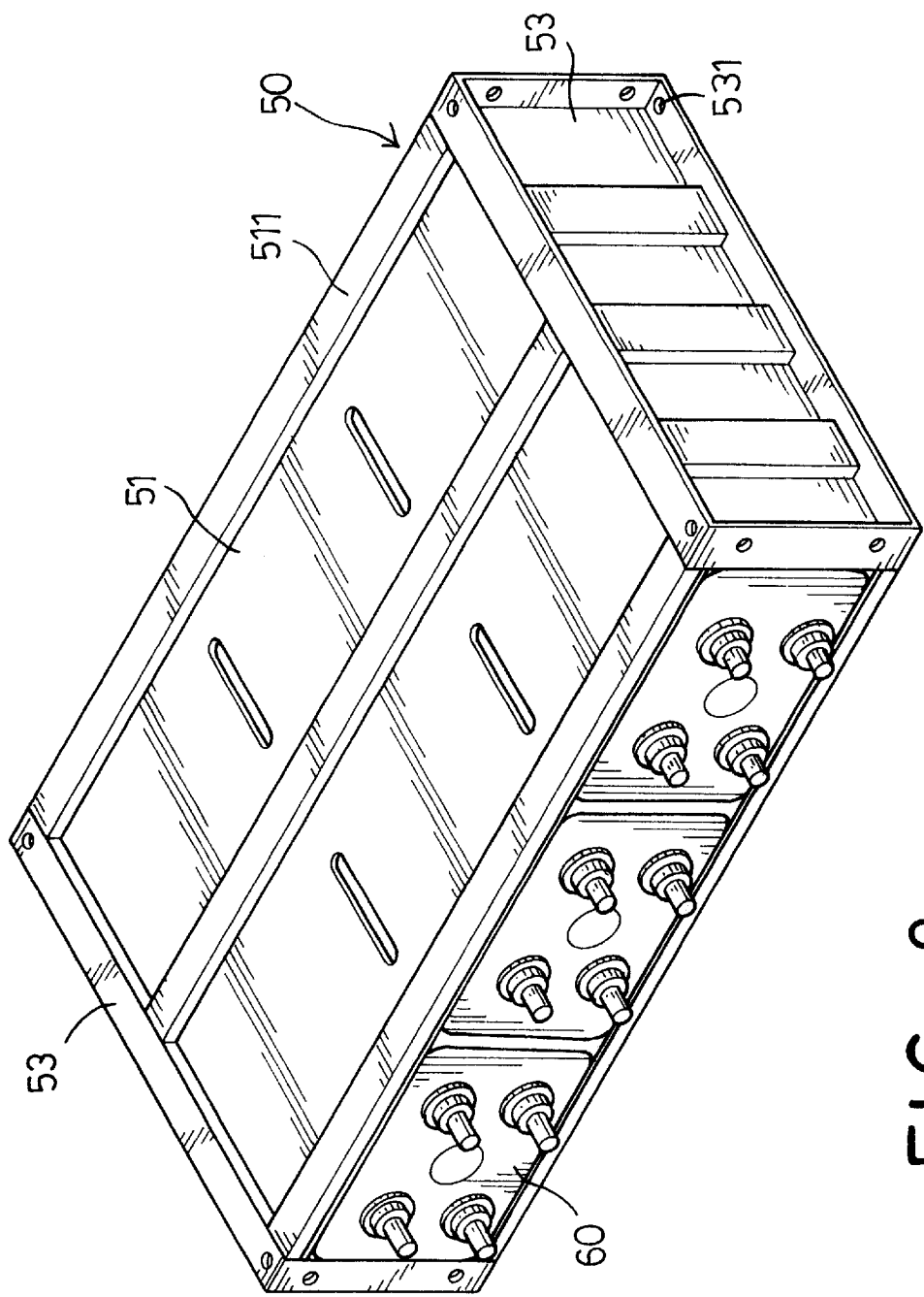
FIG. 8 is a perspective view of a conventional modular backup power housing module.
Figure 9:
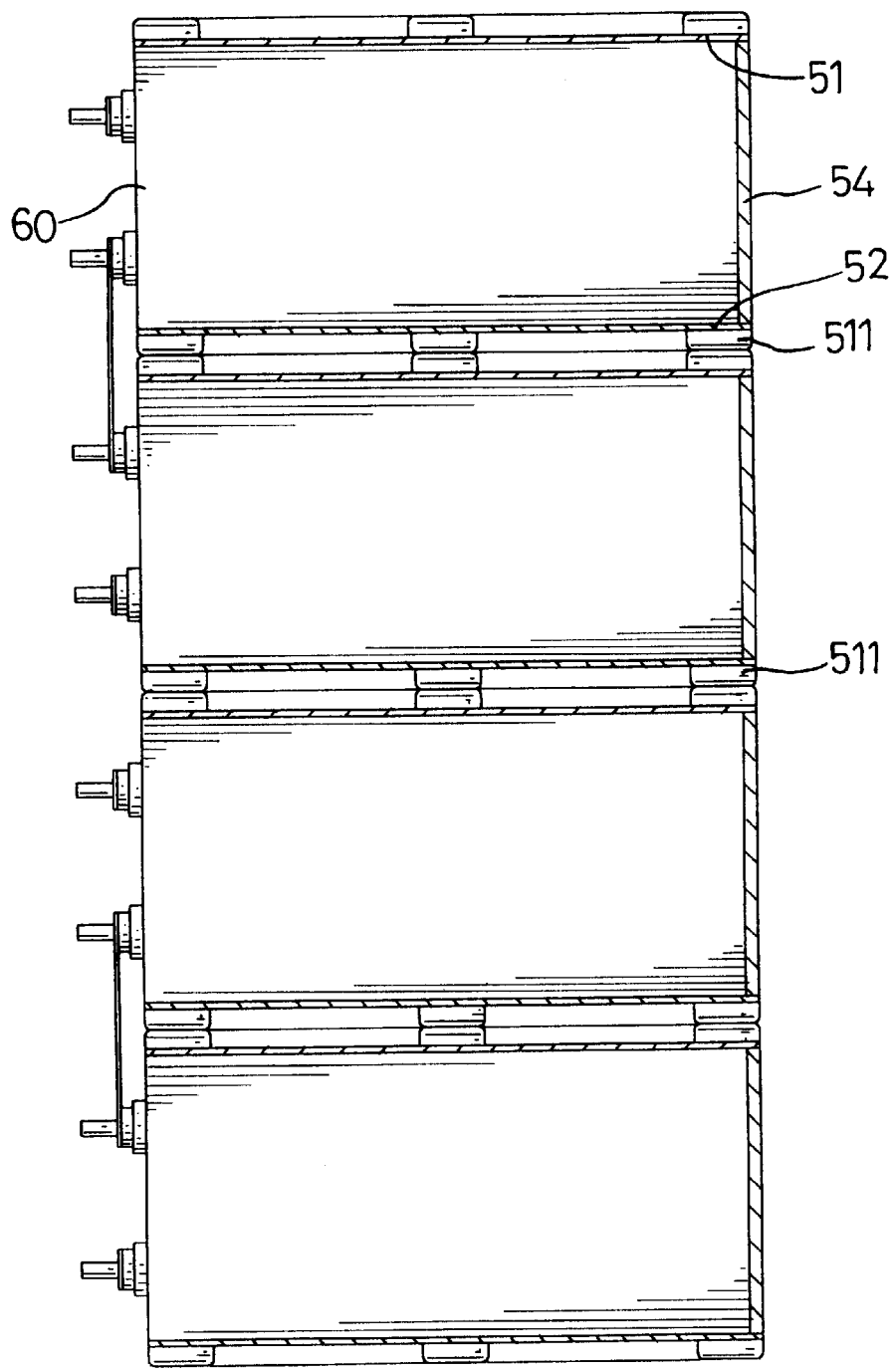
FIG. 9 is a cross-sectional side plan view of a conventional modular backup power housing.

With reference to FIGS. 1, 6, and 7, each module (10) has stop elements detachably secured at the front opening of the cuboid frame. With reference to FIG. 1, the stop element is an edge fitting (18) selectively attached to the threaded holes in the top rail (16) or the bottom rail (17). The edge fitting (18) is attached to the cuboid frame by bolts and partially blocks the front opening to prevent the power cells (30) from sliding out of the cuboid frame. With reference to FIG. 6, another embodiment of the stop elements uses multiple edge hasps (18a) attached to the threaded holes in the top rails (16) or bottom tracks (17) at a point where the power cells (30) abut each other. With reference to FIG. 7, each of the edge hasps (18a) further has a slit (182) defined in the edge hasps (18a). The dividing plate (14) further has a locking tab (142) protruding from the dividing plate (14) to penetrate the slit (182) and attach to the corresponding edge hasp (18a) by pins (not numbered) attaching on the locking tab (142).

The modular backup power housing as described has a lower center of gravity than the conventional housing, because the top rail (16) and the bottom rail (17) of adjacent modules (10) mesh with each other. Therefore, the distance between adjacent modules (10) is only slightly more than the thickness of the top rails (16) or the bottom tracks (17) rather than the sum of the thickness as is the case with the stringers (511) in the conventional housing. This feature lowers the overall height, which lowers the center of gravity. Moreover, the top rail (16) and the bottom rail (17) engage and mesh with each other along their entire length. This feature provides additional strength to the modular backup power housing particularly in the horizontal plane, because contact is made between the wing plates along the entire length of the top rails (16) and bottom tracks (17), not just at certain bolted points as with the stringers (511) in the conventional modular backup power housing. Therefore, the modular backup power housing has a firm structure and excellent stability.

It should be clear to those skilled in the art that further embodiments can be made without departing from the scope and spirit of the present invention. Even though numerous characteristics and advantages of the present invention have been set forth in the foregoing description, together with details of the structure and function of the invention, the disclosure is illustrative only, and changes can be made in detail, especially in matters of shape, size, and arrangement of parts within the principles of the invention to the full extent indicated by the broad general meaning of the terms in which the appended claims are expressed.

What is claimed is:

1. A modular backup power housing to hold multiple power cells and comprising at least one module, where:

each module comprises a top plate with an outer surface, a bottom plate with an outer surface, two side plates mounted between the top plate and the bottom plate to form a cuboid frame having a front and rear opening and multiple ventilating holes defined in the top, bottom and side plates, and multiple top rails and bottom tracks attached to the outer surfaces of the top plate and the bottom plate, respectively each top rail and each bottom track is U-shaped and has an open side, a transverse plate and two wing plates, wherein the top rails of one module are attached to the outer surface of the top plate with the open side toward the outer surface, and the bottom tracks are attached to the outer surface of the bottom plate with the open side away from the outer surface of the bottom plate such that the top rails on one module mesh with the bottom tracks on an adjacent module.

2. The modular backup power housing as claimed in claim 1, wherein each module further has:

at least one dividing plate mounted inside the cuboid frame parallel to the side plates to divide the cuboid frame into multiple compartments to hold individual power cells; and a rear plate having an access hole mounted over the rear opening of the cuboid frame.

3. The modular backup power housing as claimed in claim 1, wherein each top rail and each bottom track has a through hole defined near each end of the top rails and bottom tracks to align with the corresponding through hole in an adjacent module; and bolts secured inside the through holes to attach the top rails to the bottom tracks.

4. The modular backup power housing as claimed in claim 2, wherein each top rail and each bottom track has a through hole defined near each end of the top rails and bottom tracks to align with the corresponding through hole in an adjacent module; and bolts secured inside the through holes to attach the top rails to the bottom tracks.

5. The modular backup power housing as claimed in claim 1, wherein a U-shaped locking frame is attached to each end of the bottom tracks by bolts.

6. The modular backup power housing as claimed in claim 2, wherein a U-shaped locking frame is attached to each end of the bottom tracks by bolts.

7. The modular backup power housing as claimed in claim 4, wherein a U-shaped locking frame is attached to each end of the bottom tracks by bolts.

8. The modular backup power housing as claimed in claim 1, wherein stop elements are detachably secured at the front opening of the cuboid frame of each module.

9. The modular backup power housing as claimed in claim 2, wherein top elements are detachably secured at the front opening of the cuboid frame of each module.

10. The modular backup power housing as claimed in claim 4, wherein stop elements are detachably secured at the front opening of the cuboid frame of each module.

11. The modular backup power housing as claimed in claim 7, wherein stop elements are detachably secured at the front opening of the cuboid frame of each module.

12. The modular backup power housing as claimed in claim 11, wherein the stop elements are multiple edge fitting attached to the cuboid frame by bolts and partially block the front opening to prevent the power cells from sliding out of the cuboid frame.

13. The modular backup power housing as claimed in claim 12, wherein the stop elements are multiple edge hasps attached to the cuboid frame at a point where adjacent power cells abut to prevent the power cells from sliding out of the cuboid frame.

14. The modular backup power housing as claimed in claim 13, wherein each of the edge hasps further has a slit defined in the edge hasps; and the dividing plate further has a locking tab protruding from the dividing plate to penetrate the slit and be secured with the edge hasps by pins through the locking tab.

15. The modular backup power housing as claimed in claim 1, wherein the modular backup power housing further comprises a base, the base comprises two parallel support members engaging with the at least one module and two parallel top rails mounted perpendicular to and on the support members to correspond to the bottom tracks of the at least one module mounted on the base.

16. The modular backup power housing as claimed in claim 15, wherein each support member is an I-beam comprised of a bottom beam, a top beam, and a web connected between the bottom beam and the top beam.

17. The modular backup power housing as claimed in claim 16, wherein multiple holes are defined in the bottom beam to attach the support member adapting to a floor or a foundation; and multiple cutouts are defined in the top beam to correspond and provide access to the holes in the bottom beam.

\* \* \* \* \*